United States Patent
Melanson et al.

(10) Patent No.: US 7,680,236 B1
(45) Date of Patent: *Mar. 16, 2010

(54) HYBRID ANALOG/DIGITAL PHASE-LOCK LOOP FOR LOW-JITTER SYNCHRONIZATION

(75) Inventors: John L. Melanson, Austin, TX (US); Zhong You, Austin, TX (US); Scott Allan Woodford, Austin, TX (US); Steven Randall Green, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 624 days.

This patent is subject to a terminal disclaimer.

(21) Appl. No.: 11/614,368

(22) Filed: Dec. 21, 2006

Related U.S. Application Data

(60) Provisional application No. 60/826,757, filed on Sep. 25, 2006.

(51) Int. Cl.
*H03D 3/24* (2006.01)
(52) U.S. Cl. .................................... 375/376
(58) Field of Classification Search ............... 375/354, 375/373, 375, 376; 331/1 R, 18, 25, 1 A; 327/156–160; 332/128
See application file for complete search history.

(56) References Cited

U.S. PATENT DOCUMENTS

| | | | |
|---|---|---|---|
| 4,636,734 A | 1/1987 | Genrich | |
| 5,521,534 A | 5/1996 | Elliott | |
| 5,600,379 A * | 2/1997 | Wagner | 348/497 |
| 5,786,778 A | 7/1998 | Adams et al. | |
| 5,898,744 A | 4/1999 | Kimbrow | |
| 6,927,642 B2 | 8/2005 | Hsieh | |
| 6,954,114 B2 | 10/2005 | Schoner | |

(Continued)

FOREIGN PATENT DOCUMENTS

WO   WO9933182 A2   7/1999

(Continued)

OTHER PUBLICATIONS

U.S. Appl. No. 11/232,650, filed Sep. 22, 2005, Melanson.

(Continued)

*Primary Examiner*—Don N Vo
(74) *Attorney, Agent, or Firm*—Andrew M. Harris; Mitch Harris, Atty at Law, LLC

(57) ABSTRACT

A hybrid analog/digital phase-lock loop for low-jitter synchronization provides a mechanism for generating a low-jitter clock from a timing reference that has a high jitter level. A numerically-controlled analog oscillator provides a clock output and has an input for receiving a rational number. The rational number represents a ratio between the frequency of the clock output and the frequency of another stable clock provided to the circuit. A counter divides the frequency of either the clock output or the stable clock, providing feedback or feed-forward control of the analog oscillator, respectively. The circuit also includes a digital phase-frequency detector for detecting an on-going phase-frequency difference between an input timing reference and an output of the divider and a digital loop filter for filtering the output of the phase-frequency detector to provide the rational number that controls the frequency of the numerically-controlled analog oscillator.

22 Claims, 6 Drawing Sheets

U.S. PATENT DOCUMENTS

| | | |
|---|---|---|
| 7,049,852 B2 | 5/2006 | Melanson |
| 7,092,476 B1 | 8/2006 | Melanson |
| 7,205,804 B2 | 4/2007 | Schoner |
| 7,474,724 B1 * | 1/2009 | Gudmunson et al. ........ 375/376 |
| 7,558,358 B1 * | 7/2009 | Melanson .................... 375/376 |

FOREIGN PATENT DOCUMENTS

| | | |
|---|---|---|
| WO | WO2004088845 A1 | 10/2004 |

OTHER PUBLICATIONS

U.S. Appl. No. 11/082,347, filed Mar. 17, 2005, Jiang et al.

U.S. Appl. No. 11/088,446, filed Mar. 24, 2005, Gudmunson et al.

U.S. Appl. No. 11/082,346, filed Mar. 17, 2005, Gudmunson et al.

U.S. Appl. No. 11/618,784, filed Dec. 30, 2006, Melanson et al.

Office Action in U.S. Appl. No. 11/618,784, Nov. 18, 2008.

* cited by examiner

HYBRID ANALOG/DIGITAL PHASE-LOCK LOOP FOR LOW-JITTER SYNCHRONIZATION

CROSS-REFERENCE TO RELATED APPLICATIONS

This application is related to U.S. provisional application Ser. No. 60/826,757, filed Sep. 25, 2006 and from which it claims benefits under 35 U.S.C. §119(e).

BACKGROUND OF THE INVENTION

1. Field of the Invention

The present invention relates generally to audio/video (AV) systems, and more specifically, to a synchronizing loop for providing a low-jitter synchronized clock signal.

2. Background of the Invention

Digital audio systems are prevalent in the areas of home entertainment, professional production of multimedia and computer reproduction and generation of multimedia sources. Increasingly, digital audio data is transported from sub-system to sub-system and device to device in both consumer and professional installations and the data is generally provided with, or has embedded, a timing reference that has too much jitter to act as a stable sample clock reference. Furthermore, the timing information may be provided at a frequency that is lower than the clock rate needed to operate a digital audio sink, such as a digital-to-analog converter (DAC) that receives the incoming digital audio data stream.

Therefore, clock generation circuits that provide stable clock references synchronized to a digital audio stream's timing information are frequently required. The clock generating circuits must generally provide a very low-jitter clock from a timing reference that may have a large amount of jitter present and/or from an additional interface clock that also may have a large amount of jitter.

World Intellectual Property Organization (WIPO) International Publication WO2004/088845A1 entitled "METHOD OF ESTABLISHING AN OSCILLATOR SIGNAL", filed by Christopher Julian Travis on Oct. 14, 2004, discloses such clock synchronizing circuits. A clock generated by an analog phase-lock loop (APLL) is synchronized to incoming time information by using a numerically-controlled oscillator that is controlled by a phase-frequency detector that compares the incoming timing information with a division of the output clock to generate an intermediate clock signal. However, the intermediate clock signal frequency places a limit on the performance of the synchronizing circuit, since the intermediate clock signal frequency typically cannot exceed the divided output clock used for phase comparison in the APLL. Furthermore, the effective information update rate in the phase comparator of the APLL is limited to a single bit of information at the intermediate clock signal frequency. The result is that the loop bandwidth of the APLL must be low enough to remove jitter from the intermediate clock signal, but high enough to remove the inherent noise of the APLL's oscillator.

The constraints on the above-described synchronization circuit reduce applicability of the circuit and place limitations on the jitter-reduction performance obtainable for a given application.

Therefore, it would be desirable to provide an improved synchronization circuit and method for generating a low-jitter clock source in synchronization with a jittery timing reference.

SUMMARY OF THE INVENTION

The above stated objectives are achieved in a synchronization circuit and method for generating an output clock signal from a timing reference. The method is a method of operation of the circuit.

The circuit includes a numerically-controlled analog oscillator that provides a clock output and has an input for receiving a rational number. The rational number represents a ratio between the frequency of the clock output and the frequency of another stable clock provided to the circuit. A counter divides the frequency of either the clock output or the stable clock, providing feedback or feed-forward control of the analog oscillator, respectively. The circuit also includes a digital phase-frequency detector for detecting an on-going phase-frequency difference between an input timing reference and an output of the divider and a digital loop filter for filtering the output of the phase-frequency detector to provide the rational number that controls the frequency of the numerically-controlled analog oscillator.

The oscillator may be a fractional-N PLL that employs a delta-sigma modulator to control a divider to conform to the rational number. The stable clock may be a LC oscillator including an on-chip inductor and capacitor to generate a low-jitter stable clock, and the rational number may be selectably provided from a programmable register for use as a stand-alone reference generator when synchronization to the timing reference is not required.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses hybrid analog/digital hybrid PLL circuits and methods of operation for providing a low-jitter clock output from a timing reference that may have a large amount of jitter. A digital PLL is used to provide a ratiometric frequency control number that is then provided to a numerically-controlled analog oscillator that generates a low jitter clock output. Feedback may be provided from the clock output to the digital PLL in a feedback configuration, or the numerically controlled oscillator may be operated in a feed-forward configuration.

Figure 1:
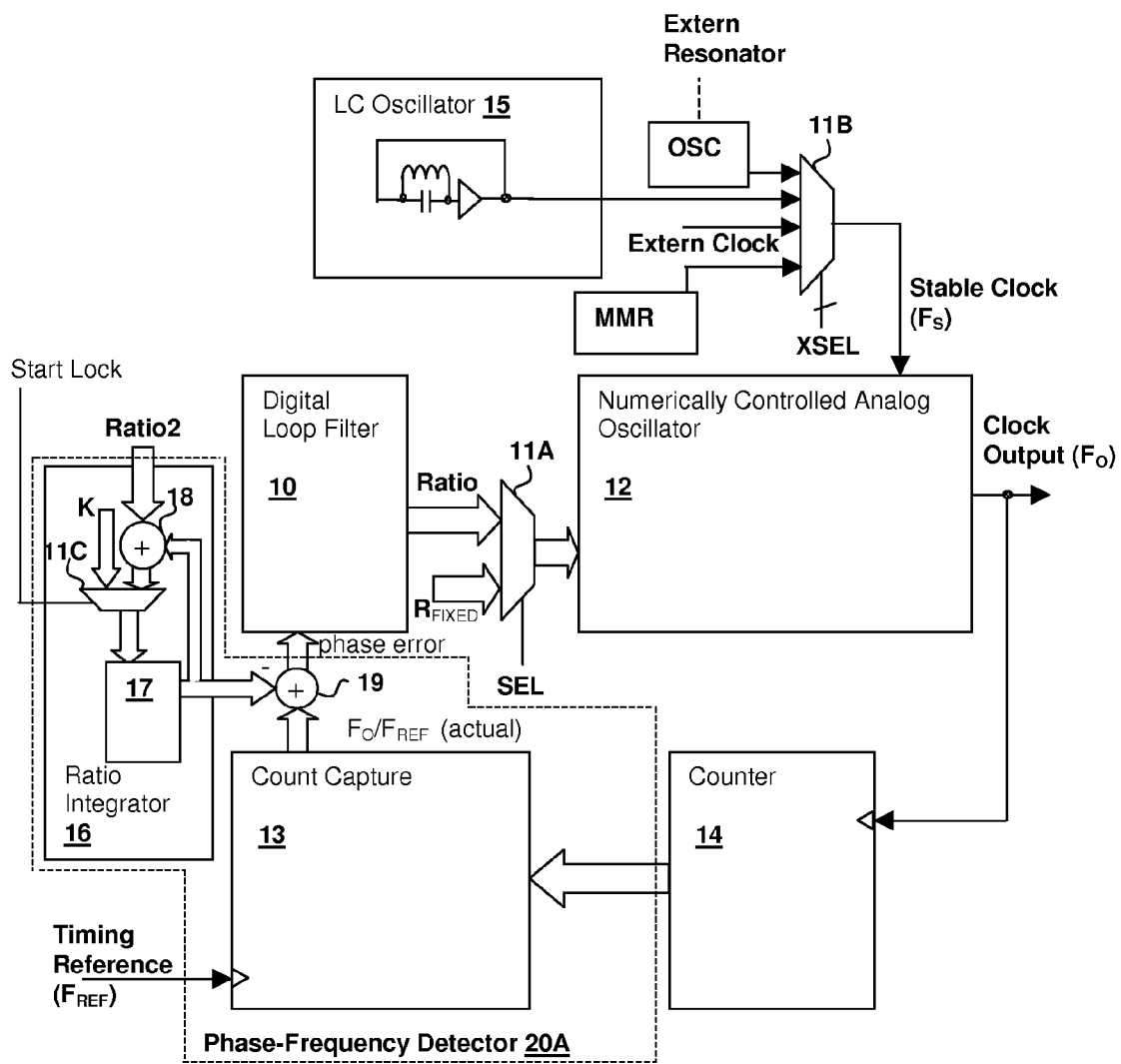
FIG. 1 is a block diagram depicting an exemplary feedback hybrid PLL circuit in accordance with an embodiment of the present invention.

Referring now to FIG. 1, an exemplary hybrid analog/digital PLL circuit in accordance with an embodiment of the invention is shown. The depicted embodiment is a feedback configuration of the hybrid analog/digital PLL, with feedback provided from the low-jitter Clock Output signal to a phase-frequency detector 20A that compares the frequency of the Clock Output signal to an expected count value determined from an accumulated phase. Phase-frequency comparator 20A includes a count capture circuit 13 that captures the count output of a counter 14 that divides the Clock Output signal by an integer divisor. The count value from a counter 14 is captured at edges of a Timing Reference signal. The captured count value provides a phase number that is the integral of the frequency ($F_O$) of the Clock Output signal over periods of the Timing Reference signal having a frequency ($F_{REF}$) and corresponds to the actual ratio of $F_O/F_{REF}$. The circuit of FIG. 1 thereby provides a low-jitter Clock Output signal that is synchronized to the Timing Reference signal. The Clock Output signal is generated by a numerically controlled analog oscillator 12 in response to a control number Ratio, which represents a rational relationship between the frequency of the Clock Output signal and that of a Stable Clock signal ($F_S$), which is provided to numerically controlled analog oscillator as a reference clock. The control number Ratio is updated by a comparison of the output count of counter 14 at the edges of the Timing Reference signal to an expected accumulated phase provided by a ratio integrator 16. The output of a phase comparator implemented by subtractor 19 is provided to a digital loop filter 10 that filters the phase difference number to provide the control number Ratio.

Subtractor 19 subtracts the expected phase value from ratio integrator 16 from the actual phase value from the output of count capture 13 and thus implements a phase comparator. Ratio integrator 16 integrates a ratio control number Ratio2 using a summer 18 and holds the accumulated value in a latch 17 to provide a number that represents an expected on-going accumulated phase count of the divided clock output provided from counter 14 as adjusted by any frequency offset required to generate the desired Clock Output signal frequency $F_O$ from numerically controlled analog oscillator 12. The combination of counter 14, count capture 13, ratio integrator 16, and subtractor 19 can be viewed as a phase comparator that compares a phase determined from the ratio Ratio2 with a phase determined from the Clock Output signal. Modulo arithmetic is employed in summer 18, ratio integrator 16, and subtractor 19, so that overflow of phase accumulation does not cause ambiguities or error. In particular, the bit width of the count output of counter 14 is equal to that of subtractor 19 and ratio integrator 16 and must be sufficiently wide so that counter 14 will not overflow for the lowest possible Timing Reference signal frequency $F_{REF}$ to which the loop will synchronize. A multiplexer 11C selects between the output of summer 18 and a fixed value K that compensates for the delay through count capture circuit 13 and is preloaded into latch 17 by the Start Lock signal to initialize ratio integrator 16 to produce the proper phase relationship between the Timing Reference signal and the count output of counter 14.

Digital loop filter has a bandwidth sufficiently low to remove error due to jitter in the Timing Reference signal so that the Ratio output number from digital loop filter 10, on average, represents the ratio of the frequency $F_S$ of the Stable Clock signal to the frequency $F_O$ of the Clock Output signal. In the depicted embodiment, a selector 11A is provided so that numerically controlled analog oscillator 12 can be operated from a fixed ratio $R_{FIXED}$ when synchronization to the Timing Reference signal is not required. The $R_{FIXED}$ ratio number may be provided, for example, from a program accessible register in an integrated circuit implementing the circuit of FIG. 1, and is useful in applications such as providing audio playback clock sources where no external Timing Reference is supplied. When selection signal SEL is in a first state, the feedback loop through counter 14 is closed, causing the Clock Output signal to synchronize to the Timing Reference signal with a frequency relationship determined according to the Ratio2 value, when selection signal SEL is in a second state, numerically controlled analog oscillator 12 is provided the fixed ratio $R_{FIXED}$ to control the frequency of the Clock Output signal. The SEL signal is also supplied to numerically controlled analog oscillator 12, so that when fixed ratio $R_{FIXED}$ to control the frequency of the Clock Output signal, if $R_{FIXED}$ is an integer ratio, the fractional operation of numerically controlled analog oscillator 12 can be bypassed to reduce tracking error and noise as will be described in further detail below.

The Stable Clock signal may be provided from a variety of sources. In particular, in accordance with an embodiment of the present invention, an LC oscillator 15, incorporating an inductor and capacitor resonator, provides a stable reference source that can be incorporated easily in an on-die implementation along with the circuit of FIG. 1. A quality factor (Q) of 10 or more can be achieved, which is sufficient to provide a stable clock signal for operating numerically controlled analog oscillator 12, but provides advantages over prior art implementations such as RC oscillators and constant current ramp generators that have too low a Q to provide a sufficiently stable clock source for jitter reduction. In the depicted embodiment, flexible clock source selection is provided by a selector 11B that supports selection according to a selection value XSEL between an Extern Clock terminal accepting an external clock source, an on-chip micro-mechanical resonator MMR or an on-chip oscillator OSC that has one or more input terminals Extern Resonator for connection to an external resonator, such as a crystal or ceramic resonator.

Figure 2:
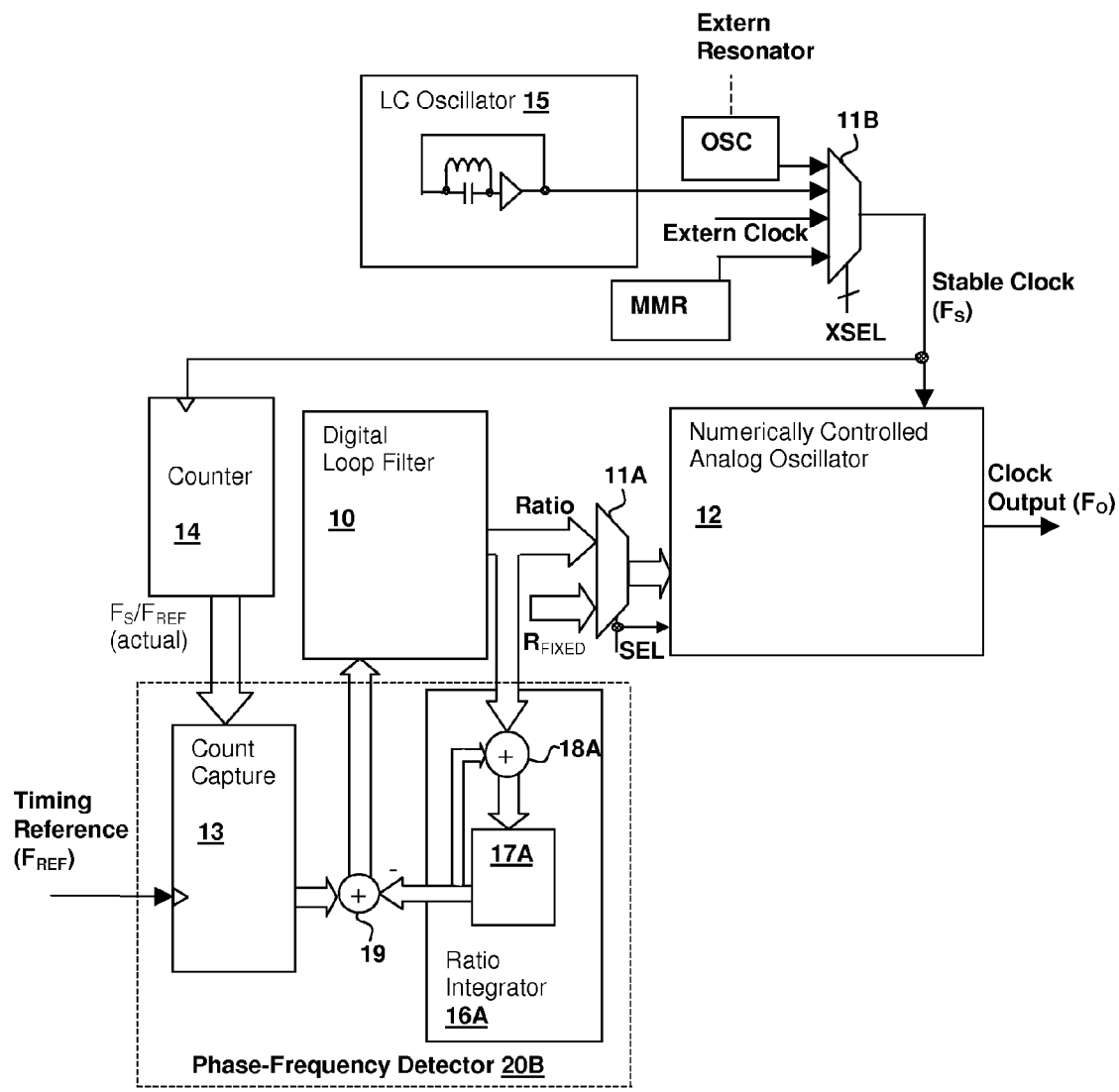
FIG. 2 is a block diagram depicting an exemplary feed-forward hybrid PLL circuit in accordance with an embodiment of the present invention.

Referring now to FIG. 2, an exemplary hybrid analog/digital PLL circuit in accordance with another embodiment of the invention is shown. The depicted embodiment is a feed-forward configuration of the hybrid analog/digital PLL, with no feedback provided from the low-jitter Clock Output signal to the front-end digital phase lock loop. The circuit of FIG. 2 is similar to that of FIG. 1 and therefore only differences between the two circuits will be discussed in detail below. In the depicted embodiment, the phase comparator is still implemented by a subtractor 19, but overall a phase-frequency comparator 20B in the depicted embodiment differs in structure from that of phase comparator 20A of FIG. 1. In phase comparator 20B, the phase inputs are derived in a manner different from that illustrated in the embodiment of FIG. 1. It is understood that either phase comparison strategy may be employed in either a feedback or feed-forward configuration with appropriate modifications. However, it is advantageous to use phase-frequency comparator 20A of FIG. 1 in feedback configurations due to the actual feedback from the clock output, while phase-frequency comparator 20B is simpler.

In the feed-forward circuit of FIG. 2, Counter 14 is clocked by the Stable Clock signal, and numerically controlled analog oscillator 12 is operated without global feedback, so that the Ratio number is not adjusted in response to variation in the Clock Output signal frequency, but is adjusted in conformity with any variation in the Stable Clock signal frequency. Count capture circuit 13 captures the count value at edges of the Timing Reference signal, as in the circuit of FIG. 1. However, the count value in the depicted embodiment represents the ratio of $F_S/F_{REF}$ and is therefore not dependent on the frequency of the Clock Output signal. The output of count capture circuit 13 is compared with an accumulated phase number that is directly integrated from the Ratio control number by ratio integrator 16A, which includes a summer 18A and latch 17A as in ratio integrator 16 of FIG. 1. Since the Ratio control number represents a frequency, an integration of the Ratio control number represents the phase and can be used directly in the feed-forward implementation without the introduction of additional fixed ratio Ratio2 to accumulate as in the circuit of FIG. 1.

Figure 3:
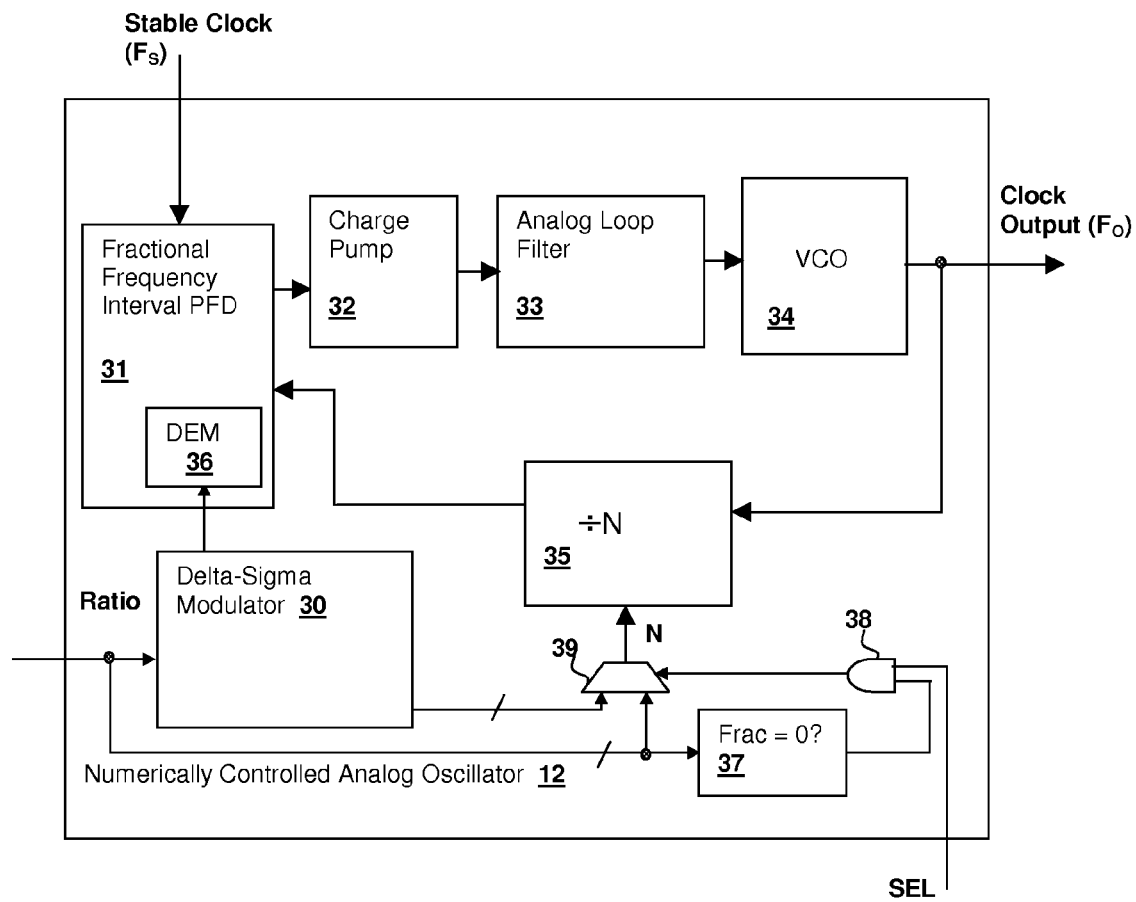
FIG. 3 is a block diagram depicting details of an exemplary numerically controlled analog oscillator 12 that may be used in the circuits of FIG. 1 and FIG. 2.

Referring now to FIG. 3, an exemplary circuit that can be used to implement numerically controlled analog oscillator 12 in the circuits of FIG. 1 and FIG. 2 is shown. The depicted circuit is disclosed in detail in U.S. Pat. No. 7,049,852, entitled "FRACTIONAL-INTEGER PHASE-LOCKED LOOP SYSTEM WITH A FRACTIONAL-FREQUENCY-INTERVAL PHASE FREQUENCY DETECTOR", issued to John L. Melanson on May 23, 2006, which is incorporated herein by reference. Furthermore, FIG. 1 of the above-incorporated U.S. patent discloses another numerically-controlled analog oscillator that may be alternatively used to implement numerically controlled analog oscillator 12 in the circuits of FIG. 1 and FIG. 2 if the wider-bandwidth and otherwise higher performance of the circuit depicted in FIG. 3 is not required for a given application. The circuit of FIG. 3 provides a low-jitter Clock Output signal that is determined by an input Ratio number and the frequency of the Stable Clock signal.

The Clock Output signal is provided from a voltage-controlled analog oscillator (VCO) 34 that receives a frequency control voltage from an analog loop filter 33. A fractional frequency interval phase-frequency detector (PFD) 31 provides a correction signal to charge pump 32, which is then filtered by analog loop filter 33 to generate the frequency control voltage. Fractional frequency interval PFD 31 compares the frequency and phase of the Stable Clock signal to the output of a divider 35 that divides the Clock Output signal by an integer value N. A delta-sigma modulator 30 varies integer value N according to the Ratio value and the noise shaping transfer function of delta-sigma modulator 30 so that the average frequency at the output of divider 35 is equal to the frequency $F_S$ of the Stable Clock signal. As mentioned above, when the SEL signal indicates that a fixed ratio $R_{FIXED}$ is being provided as the Ratio value, and the Ratio value has no fractional part as determined by comparison logic 37, then logical AND gate 38 selects the Ratio value via multiplexer 39 as the division factor of divider 35, rather than the output of delta-sigma modulator 30, to reduce tracking error and noise. A dynamic element matching block (DEM) 36 in fractional frequency interval PFD 31 receives the modulator feedback signal from delta-sigma modulator 30. The DEM 36 provides for matching of individual elements in fractional frequency interval PFD 31, which actually comprises multiple parallel phase-frequency detectors having inputs provided from a selection between the output of divider 35 and a delayed version of the output of divider 35, as described in further detail in the above-incorporated U.S. patent.

Figure 4A:
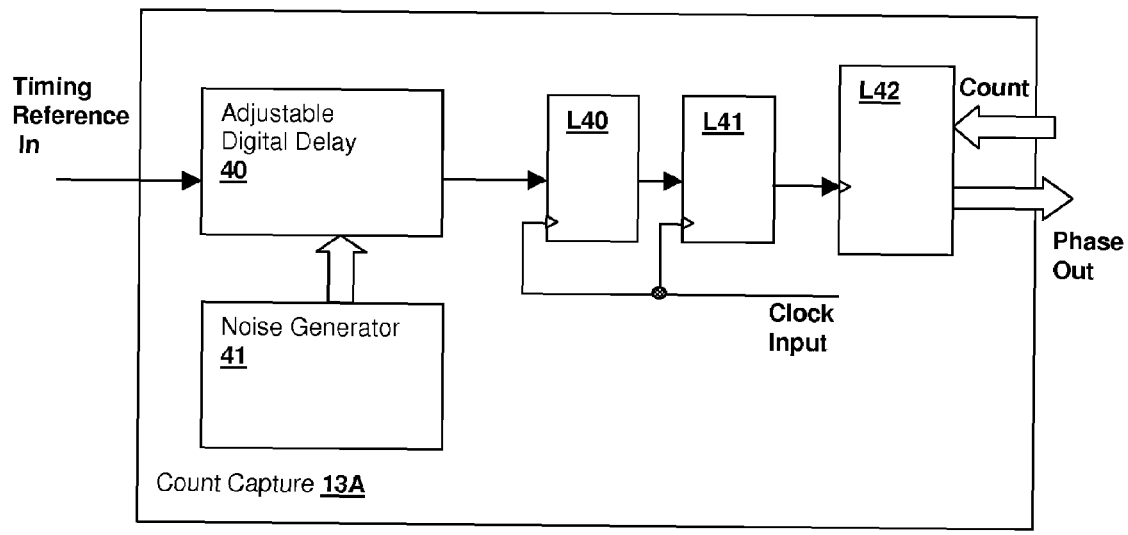
FIGS. 4A-4B are schematic diagrams of count capture circuits that may be used to implement count capture circuit 13 in the circuits of FIG. 1 and FIG. 2.

Referring now to FIG. 4A, a count capture circuit 13A that can be used to implement count capture circuit 13 of FIGS. 1-2 is illustrated. Due to the sampling of the output of counter 14 by the edges of the Timing Reference signal, jitter tones can be generated by the sampling action. Dithering is applied to effectively remove the jitter tones by spreading their energy over a broad frequency range. In the depicted embodiment, an adjustable digital delay 40, which may be a shift register with a tap selector, is controlled by a noise generator 41 that varies the delay pseudo-randomly. The output of adjustable digital delay 40 is stabilized by a pair of latches L40 and L41, which are clocked by a Clock Input signal. The Clock Input signal is provided from the Clock Output signal in the embodiment of FIG. 1 or the Stable Clock signal in the embodiment of FIG. 2. A third latch L42 is clocked by the dithered Timing Reference signal and captures the Count output of counter 14 to generate the phase number output of count capture circuit 13.

Figure 4B:
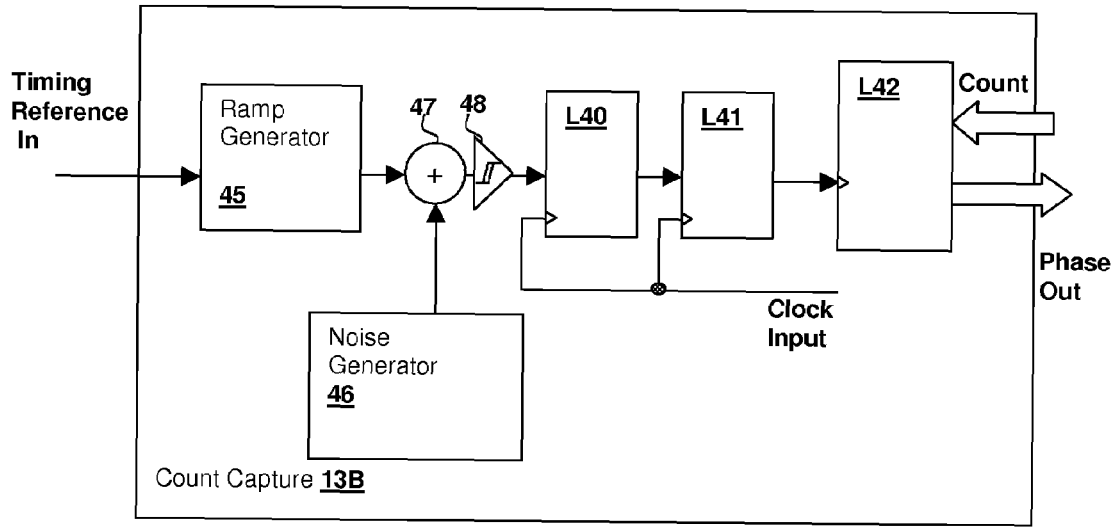

Referring now to FIG. 4B, a count capture circuit 13B that can alternatively be used to implement count capture circuit 13 of FIGS. 1-2 is illustrated. An analog ramp generator 45 is triggered by edges of the Timing Reference signal and the output of ramp generator 45 is summed with the output of an analog noise generator 46 by a summer 47. A hysteresis comparator 48 compares the output of summer 47 with a threshold to generate the input to latch L40. The balance of the circuit operates as described above with respect to FIG. 4A.

Figure 5A:
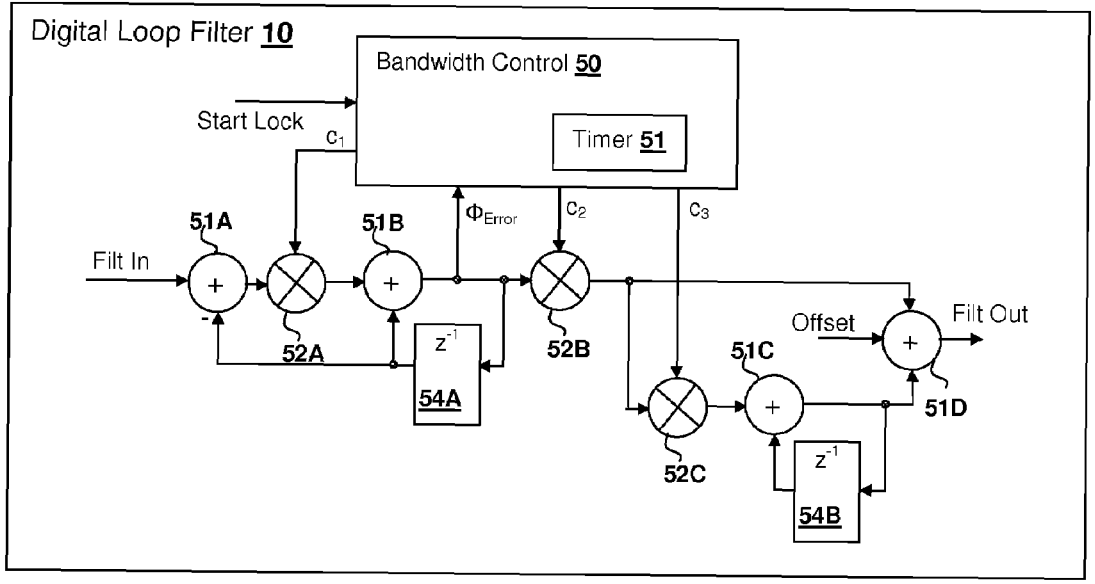
FIG. 5A is a block diagram depicting details of a digital loop filter 10 that may be used in the circuits of FIG. 1 and FIG. 2.

Referring now to FIG. 5A, details of a digital loop filter that can be used to implement digital loop filter 10 of FIG. 1 and FIG. 2 is shown. In the depicted embodiment, a second-order digital filter is implemented by a first integrator formed by unit delay 54A and summer 51B and a second integrator formed by unit delay 54B and summer 51C. The filter has variable coefficients $c_1$, $c_2$, and $c_3$, which are introduced by multipliers 52A, 52B and 52C from a bandwidth control block 50. The first portion of the filter comprising summers 51A, 51B, multiplier 52A, and unit delay 54A, provides a phase error input signal $\Phi_{Error}$ to bandwidth control block 50 and has a z-domain response of:

$$c_1 \left[ \frac{1-z^{-1}}{1-\frac{z^{-1}}{c_1}} \right]$$

With $c_1 > 1$, the response at the phase error input signal $\Phi_{Error}$ output is thus a low pass filter with a pole above the corner frequency that provides an indication of the magnitude of phase tracking error (including jitter magnitude) to bandwidth control block 50, while removing the DC component and low frequency artifacts at the output of subtractor 19.

The second portion of the filter includes multipliers 52B, 52C, summers 51C, 51D and delay 54B, and has a z-domain response of:

$$c_2 [1-c_3 [-c_3 z^{-1}[$$

which introduces a second zero to attenuate high frequencies representing noise and detector harmonics that would otherwise introduce jitter in the Ratio control number provided to numerically controlled analog oscillator 12.

Figure 5B:
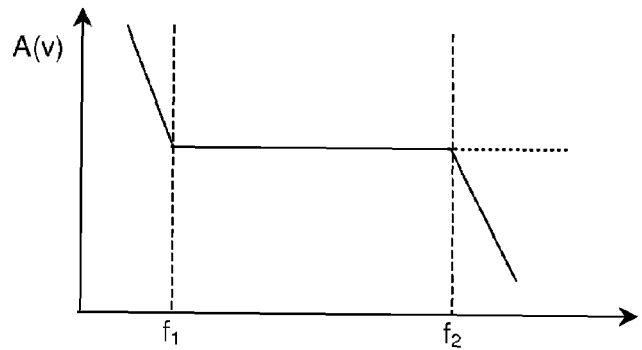
FIG. 5B is a Bode amplitude plot depicting the frequency response of digital loop filter 10 of FIG. 5A.

FIG. 5B illustrates the response of digital loop filter 10 at the Filt Out output, which is a classical phase-lock loop filter response for edge (frequency) sensitive detectors. The pole of the first filter portion controlled by coefficient $c_1$ is at frequency $f_1$ and the zero introduced by the second filter portion is at frequency $f_2$. The filter response at the phase error signal $\Phi_{Error}$ output from summer 51B where it diverges from the total filter response above frequency $f_2$ is shown as a dotted line.

Figure 6:
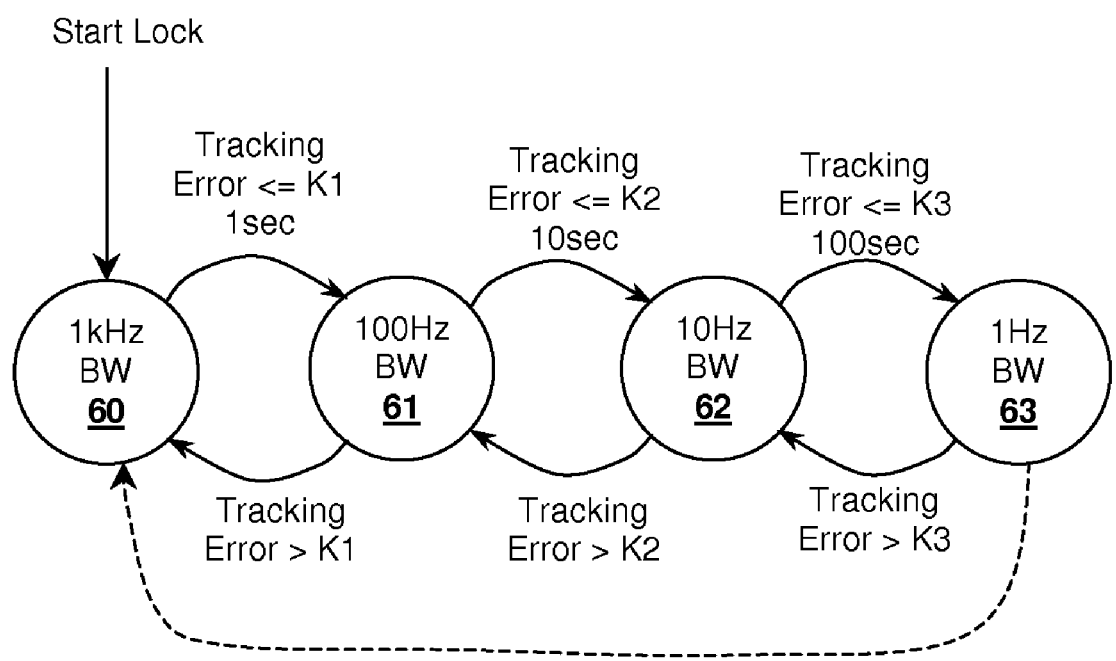
FIG. 6 is a state diagram depicting the operation of bandwidth control circuit 50 of FIG. 5A.

Bandwidth control block 50 adjusts coefficients $c_1$, $c_2$, and $c_3$ dynamically, according to a control algorithm and a timer 51. In response to a Start Lock signal or other suitable startup mechanism, bandwidth control adjusts the $c_1$, $c_2$, and $c_3$ to change the bandwidth of the loop, so that until the loop begins to lock, the widest bandwidth is selected as further illustrated in a state diagram of FIG. 6 in which an exemplary loop bandwidth of 1 kHz is chosen as a starting point in state 60. Until the phase tracking error as measured by detecting the magnitude of phase error signal $\Phi_{Error}$ is less than or equal to a threshold K1, bandwidth control block 50 remains in state 60. When the tracking error level falls below threshold K1 for one second, bandwidth control block 50 transitions to state 61, in which the loop bandwidth is lowered to 100 Hz. Similarly, when the tracking error level falls below threshold K2 for 10 seconds, bandwidth control block 50 transitions to state 62, in which the loop bandwidth is lowered to 10 Hz. Finally, when the tracking error level falls below threshold K3 for 100 seconds, bandwidth control block 50 transitions to state 63, in which the loop bandwidth is lowered to 1 Hz. If at any time the tracking error threshold level is exceeded in any given state, bandwidth control block 50 transitions immediately to the previous wider bandwidth state and starts the phase tracking error test for transition to a lower bandwidth state again. Thresholds K1, K2, and K3 may differ for each state as illustrated, or may be the same value, with only the time delay determinative of progression to more narrow-band states. If the thresholds are all equal, then the transition from state 63 may be made to state 60 when the phase tracking error exceeds the threshold as shown by the dashed line.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for providing a low-jitter clock output synchronized to a timing reference having jitter, said circuit comprising:
    a numerically-controlled analog oscillator for providing said clock output and having an input for receiving a rational numeric representation of a ratio between a frequency of said clock output and a frequency of a stable clock for controlling said frequency of said clock output;
    a counter for dividing a frequency of one of said clock output and said stable clock;
    a digital phase-frequency detector for generating a representation of an on-going phase-frequency difference between said timing reference and an output of said counter; and
    a digital loop filter for filtering said representation of said on-going phase-frequency difference to provide said rational numeric representation to said numerically-controlled analog oscillator.

2. The circuit of claim 1, wherein said counter divides said frequency of said clock output, wherein said counter provides phase-frequency feedback from said clock output of said numerically-controlled analog oscillator, whereby said numerically-controlled analog oscillator is controlled by said feedback.

3. The circuit of claim 1, wherein said counter divides said frequency of said stable clock, whereby said numerically-controlled analog oscillator is operated in a feed-forward mode.

4. The circuit of claim 1, wherein said numerically-controlled analog oscillator circuit comprises:
    a voltage controlled oscillator for providing said clock output;
    a local divider for dividing said clock output in conformity with a divisor input;
    a local phase-frequency detector for comparing an output of said local divider with said stable clock;
    an analog loop filter for filtering an output of said local phase-frequency detector to provide a control input of said voltage controlled oscillator; and
    a delta-sigma modulator having an input coupled to an output of said local phase-frequency detector and an output providing said divisor input of said local divider.

5. The circuit of claim 4, wherein said local phase-frequency detector comprises:
    a delay circuit for delaying said clock output to provide a delayed clock;
    a selector circuit for selecting between said clock output and said delayed clock; and
    a plurality of phase-frequency detector units each having a first input coupled to said stable clock and a second input coupled to an output of said selector circuit, and wherein said selector circuit is controlled by an output of said delta-sigma modulator, and wherein said control input of said voltage controlled oscillator is provided by summing outputs of said phase-frequency detector units, whereby a frequency of said clock output is controlled to enforce said ratio.

6. The circuit of claim 1, wherein said digital phase-frequency detector comprises a capture latch for capturing a count of said counter at edges of said timing reference.

7. The circuit of claim 6, further comprising:
    a digital integrator for providing an expected phase number from a ratio number;
    a subtractor for subtracting said integrated expected phase number from said captured count to determine a phase error.

8. The circuit of claim 7, further comprising a preload circuit for preloading said digital integrator with an initial phase number whereby a relationship between said expected phase number and an output of said counter is established.

9. The circuit of claim 1, further comprising an inductor-capacitor resonator tuned (LC) oscillator for providing said stable clock to said numerically-controlled analog oscillator.

10. The circuit of claim 1, further comprising a selector for having an output for providing said stable clock to said numerically-controlled analog oscillator and a plurality of inputs coupled to multiple sources, whereby a source of said stable clock may be selected from among said multiple sources.

11. The circuit of claim 1, further comprising a selector having an output coupled to said input of said numerically controlled oscillator, a first input coupled to said output of said digital loop filter, a second input for receiving a fixed ratio number and a select input for selectably applying one of said output of said digital loop filter and said fixed ratio number to said input of said numerically controlled oscillator in response to a selection signal, whereby said circuit is selectably operable as a phase-lock loop and a fixed frequency generator.

12. The circuit of claim 11, further comprising a comparison circuit for determining whether said fixed ratio number is an integer, wherein said numerically controlled digital oscillator comprises a fractional delta-sigma modulator controlled phase-lock loop, and wherein said delta-sigma modulator is bypassed when said fixed ratio is applied to said input of said numerically-controlled oscillator and said fixed ratio number is an integer.

13. The circuit of claim 1, wherein said digital loop filter comprises a control circuit for dynamically adjusting a bandwidth of said digital loop filter.

14. The circuit of claim 13, wherein said control circuit adjusts said bandwidth of said digital loop filter in response to a measurement of phase tracking error present in said rational numeric representation, such that said bandwidth is progressively narrowed as said phase tracking error is reduced by action of said circuit and widened as said phase tracking error increases.

15. The circuit of claim 14, wherein said digital loop filter includes a phase error output separate from a primary output of said digital loop filter that provides said input of said numerically-controlled analog oscillator, wherein said phase error output is coupled to said control circuit of said digital loop filter to provide said measurement of phase tracking error.

16. A method of providing a low-jitter clock signal synchronized to a timing reference having jitter, said method comprising:
generating a clock output from a numerically-controlled analog oscillator ratiometrically locked to a stable clock source, wherein a frequency of said clock output is controlled by a rational numeric representation of a ratio between a frequency of said clock output and a frequency of said stable clock;
dividing a frequency of one of said clock output and said stable clock;
generating a representation of an on-going phase-frequency difference between said timing reference and a result of said dividing; and
filtering said representation of said on-going phase-frequency difference with a digital filter to provide said rational numeric representation to said numerically-controlled analog oscillator.

17. The method of claim 16, wherein said dividing comprises dividing said frequency of said clock output to provide phase-frequency feedback from said clock output, whereby said frequency of said clock output is controlled by said feedback.

18. The method of claim 16, wherein said dividing comprises dividing said frequency of said stable clock, whereby said numerically-controlled analog oscillator is operated in a feed-forward mode.

19. The method of claim 16, further comprising:
measuring a level of phase tracking error present in said rational numeric representation; and
dynamically adjusting a bandwidth of said filtering in response to a result of said measuring.

20. A numerically-controlled analog oscillator circuit integrated on a single die, comprising:
a voltage controlled oscillator for providing a clock output;
an inductor-capacitor resonator tuned (LC) oscillator for providing a stable clock;
a local divider for dividing said clock output in conformity with a divisor input;
a phase-frequency detector for comparing an output of said local divider with said stable clock;
an analog loop filter for filtering an output of said phase-frequency detector to provide a control input of said voltage controlled oscillator; and
a delta-sigma modulator having an input coupled to an output of said phase-frequency detector and an output providing said divisor input of said local divider.

21. The numerically-controlled oscillator circuit of claim 20, wherein said phase-frequency detector comprises:
a delay for delaying said clock output to provide a delayed clock;
a selector circuit for selecting between said clock output and said delayed clock; and
a plurality of phase-frequency detector units each having a first input coupled to said stable clock and a second input coupled to an output of said selector circuit, and wherein said selector circuit is controlled by an output of said delta-sigma modulator, and wherein said control input of said voltage controlled oscillator is provided by summing outputs of said phase-frequency detector units, whereby a frequency of said clock output is controlled to enforce said ratio.

22. The numerically-controlled oscillator circuit of claim 20, comprising a selector for having an output for providing said stable clock to said numerically-controlled analog oscillator and a plurality of inputs coupled to multiple sources including an output of said inductor-capacitor resonator tuned (LC) oscillator, whereby a source of said stable clock may be selected from among said multiple sources including said inductor-capacitor resonator tuned (LC) oscillator.

* * * * *